United States Patent [19]
Caveney et al.

[11] Patent Number: 5,743,704
[45] Date of Patent: Apr. 28, 1998

[54] WIDE WRIST ARTICULATED ARM TRANSFER DEVICE

[75] Inventors: Robert T. Caveney, Windham; Christopher A. Hofmeister, Hampstead, both of N.H.

[73] Assignee: Brooks Automation, Inc., Chelmsford, Mass.

[21] Appl. No.: 833,768

[22] Filed: Apr. 9, 1997

Related U.S. Application Data

[63] Continuation of Ser. No. 573,500, Dec. 15, 1995, abandoned.

[51] Int. Cl.⁶ .................................................. B25J 18/04
[52] U.S. Cl. ................................... 414/744.5; 901/15
[58] Field of Search ...................... 414/744.5, 744.6; 901/15; 74/490.01, 490.08, 490.09

[56] References Cited

U.S. PATENT DOCUMENTS

| | | | |
|---|---|---|---|
| 629,698 | 7/1899 | Miller. | |
| 1,204,276 | 11/1916 | Johnson. | |
| 2,580,829 | 1/1952 | Peck | 254/122 |
| 3,522,838 | 8/1970 | Ott | 164/404 |
| 3,730,595 | 5/1973 | Yakubowski | 302/2 R |
| 3,823,836 | 7/1974 | Cheney et al. | 214/16.4 R |
| 3,874,525 | 4/1975 | Hassan et al. | 214/17 B |
| 3,921,788 | 11/1975 | Roberson, Jr. et al. | 198/19 |
| 4,062,463 | 12/1977 | Hillman et al. | 214/301 |
| 4,139,104 | 2/1979 | Mink | 214/1 BB |
| 4,208,159 | 6/1980 | Uehara et al. | 414/225 |
| 4,218,173 | 8/1980 | Coindet et al. | 414/730 |
| 4,275,978 | 6/1981 | Brooks et al. | 414/156 |
| 4,295,780 | 10/1981 | Wada et al. | 414/749 |
| 4,507,044 | 3/1985 | Hutchins et al. | 414/744 R |
| 4,666,366 | 5/1987 | Davis | 414/749 |
| 4,730,976 | 3/1988 | Davis et al. | 414/749 |
| 4,909,701 | 3/1990 | Hardegen et al. | 414/749 |
| 5,147,175 | 9/1992 | Tada | 414/744.5 X |
| 5,180,276 | 1/1993 | Hendrickson | 901/15 X |
| 5,431,529 | 7/1995 | Eastman et al. | 901/15 X |
| 5,447,409 | 9/1995 | Grunes et al. | 414/744.6 |

FOREIGN PATENT DOCUMENTS

| | | | |
|---|---|---|---|
| 4122589 | 4/1992 | Japan | 414/744.5 |
| 95/14555 | 6/1995 | WIPO | 414/744.5 |

*Primary Examiner*—Donald W. Underwood
*Attorney, Agent, or Firm*—Perman & Green, LLP

[57] ABSTRACT

Apparatus for transferring an object between spaced locations comprises first and second articulated arms mounted on a support, each articulated arm having a drive member disposed for rotation about a drive axis and, pinned to it, a shorter driven member. A wrist plate with an integral holding platform is pivotally coupled to the driven members at spaced apart locations. The drive members are rotated from an initial position at which they subtend a first acute angle with the holding platform at an initial position through an intermediate position at which they subtend an angle of 180° to a final position at which they subtend a second acute angle oppositely disposed from the first acute angle with the holding means at a final position overlying the drive axis. The wrist plate extends transverse of the extend-retract path for the holding platform. A pair of spaced pivot drums project from a surface of the wrist plate and distal bores of the first and second driven members are pivotally engaged with the pivot drums. A wrist link mechanism extends between and interconnects the distal ends of the first and second driven members such that equal and opposite rotational movements of the second driven member are imparted to the first driven member. This assures that as the holding platform moves between the initial and final positions, the orientation of the platform remains substantially unchanged.

9 Claims, 6 Drawing Sheets

WIDE WRIST ARTICULATED ARM TRANSFER DEVICE

This application is a continuation of application Ser. No. 08/573,500 filed on Dec. 15, 1995 and now abandoned.

BACKGROUND OF THE INVENTION

1. Field of the Invention

The present invention relates generally to material transfer devices, and more specifically to an apparatus for transferring silicon wafers to and from a plurality of work stations.

2. Description of the Prior Art

The transfer of delicate silicon wafers or the like between a plurality of work stations or locations in the manufacture of semiconductor devices presents unique handling problems. The silicon wafers are very delicate and have highly polished surfaces. When the wafers are abruptly moved, they tend to slide. This sliding action can cause the silicon wafers to abrade or alternatively can cause damage to their edges if they collide.

There are numerous devices described in the prior art for transferring silicon wafers. For example:

U.S. Pat. No. 3,823,836 discloses an apparatus which includes a supply carrier with a plurality of edges to hold the silicon wafers and a withdrawal device having a vacuum chuck. The vacuum chuck is attached to an elevator which raises and lowers the chuck. A horizontal transfer arm coupled to the vacuum chuck is used to transfer the silicon wafer from the supply carrier to a desired work station.

U.S. Pat. No. 3,730,595 discloses a wafer transfer handling apparatus having an indexable carrier for transferring wafers to and from work stations. Wafers enter and leave the wafer carrier on an air slide with the aid of a wafer ejector acceptor arm having directional air jets. The wafer ejector acceptor arm controls the driving of the wafers into or out of the carrier from or on to the air slide, which moves the wafers to or from a work station.

U.S. Pat. Nos. 4,062,463, 3,974,525 and 4,208,159 also disclose wafer transfer devices which include either pneumatic components or gripping devices for handling the wafers.

The above described devices of the prior art utilize relatively complex and costly pneumatic components or utilize undesirable gripping devices which may cause damage to the delicate wafers. Moreover, the above described devices tend to be limited to the transfer of silicon wafers between fixed locations which are difficult to change.

Accordingly, there has been a need for a simple and reliable transfer device that will not damage the object and that is capable of transferring objects between a plurality of locations disposed in various axial and radial planes.

The apparatus disclosed in U.S. Pat. Nos. 4,666,366, 4,730,976 and 4,909,701 provides a simple and reliable device for transferring objects, such as silicon wafers, camera lenses, crystal oscillators, or the like, between a plurality of locations disposed in various axial and radial planes. The apparatus includes a support, first and second articulated arms, a platform or other suitable holder coupled to the articulated arms, and a motor to drive one of the articulated arms. The two articulated arms are operatively coupled such that when one arm is driven by the motor, the articulated arms extend and retract in a "froglike" or "frogkick" type of motion. The platform having the object disposed thereon is displaced in a harmonic motion as the articulated arms extend and retract, thereby minimizing the tendency of the object to slide.

The articulated arm assembly is preferably coupled to a base via a rotation motor such that the entire articulated arm assembly may be rotated in a radial plane. The articulated arm assembly is also preferably coupled to the base via a plurality of flexures or levers that are responsive to a force such that the platform assembly may be displaced in an axial direction.

The present invention is an improvement on the articulated arm transfer device of U.S. Pat. Nos. 4,666,366, 4,730,976 and 4,909,701.

SUMMARY OF THE INVENTION

The present invention which was conceived in light of the prior art as just described and has now been reduced to practice relates to apparatus for transferring an object such as a semiconductor wafer or flat panel between spaced locations. It comprises first and second articulated arms mounted on a support, each articulated arm having a drive member disposed for rotation about a drive axis and, pinned to it, a shorter driven member. A wrist plate with an integral holding platform is pivotally coupled to the driven members at spaced apart locations. The drive members are rotated from an initial position at which they subtend a first acute angle with the holding platform at an initial position through an intermediate position at which they subtend an angle of 180° to a final position at which they subtend a second acute angle oppositely disposed from the first acute angle with the holding means at a final position overlying the drive axis. The wrist plate extends transverse of the extend-retract path for the holding platform. A pair of spaced pivot drums project from a surface of the wrist plate and distal bores of the first and second driven members are pivotally engaged with the pivot drums. A wrist link mechanism extends between and interconnects the distal ends of the first and second driven members such that equal and opposite rotational movements of the second driven member are imparted to the first driven member. This assures that as the holding platform moves between the initial and final positions, the orientation of the platform remains substantially unchanged.

With this construction, the known frog leg linkage is able to move the payload being carried on the platform closer to the center of rotation of the drive members. This, in turn allows the mechanism to maintain a smaller rotational clearance with the processing stations with which the invention is employed while maintaining a longest possible extension of the platform.

By increasing the separation between the distal ends of the driven members at their attachment locations to the wrist plate, as the wrist plate advances between the initial and final positions it is able to advance over the center of rotation for the drive members as they retract. In order to couple the two driven members such that a four bar linkage and radial tracking are maintained, a wrist link is employed to operatively interconnect the distal end of one driven member via an idler bushing which is suitably coupled to the distal end of the other driven member.

Accordingly, with this construction, a smaller package size for the transfer apparatus is achieved to assure rotational clearance with the sidewalls of ever more compact designs of processing stations for payloads such as semiconductor wafers. At the same time, the deflection of the articulated arms of the transfer apparatus is in the radial axis only with no pitch deflection as associated with a "SCARA-type" arm mechanism. Because the frog leg design is basically two sets of links (two upper arms, two forearms) that oppose each other, the effects of torsion on the links that results from the load being a moment about the center of the arm links, which can cause deflection or yaw as the arm is extending, are opposed by the opposite arm links thereby converting side to side yaw to radial deflection. With a SCARA-type arm, there is no opposing link set to keep the payload from tilting in yaw (from side to side). This is a clear advantage of the frog leg linkage construction over the SCARA-type arm.

Accordingly, a primary object of the invention is to provide a transfer mechanism which can reach to a maximum distance to retrieve a payload, yet retract to a minimal size for movement within the confines of the stations of a processing system. In other words, a primary object of the invention is to minimize the retracted rotational envelope of the transfer linkage thus allowing for smaller transport chambers which will minimize the system footprint. This result allows the process modules to move closer to the center of the rotational center of the robot thereby reducing the required extension while not sacrificing the amount of extension that the frog leg mechanism can achieve.

A further object of the invention is to provide such a transfer mechanism which is so constructed that deflections, when extended and under the weight of a payload, are minimized.

Another object of the invention is to provide such a transfer mechanism which is of simplified construction, uses materials which are commonly available, can be readily maintained, and can interface with existing processing systems.

Other and further features, advantages, and benefits of the invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention, illustrate one of the embodiments of the invention, and, together with the description, serve to explain the principles of the invention in general terms. Like numerals refer to like parts throughout the disclosure.

DESCRIPTION OF THE PREFERRED EMBODIMENTS

Figures 1, 2:
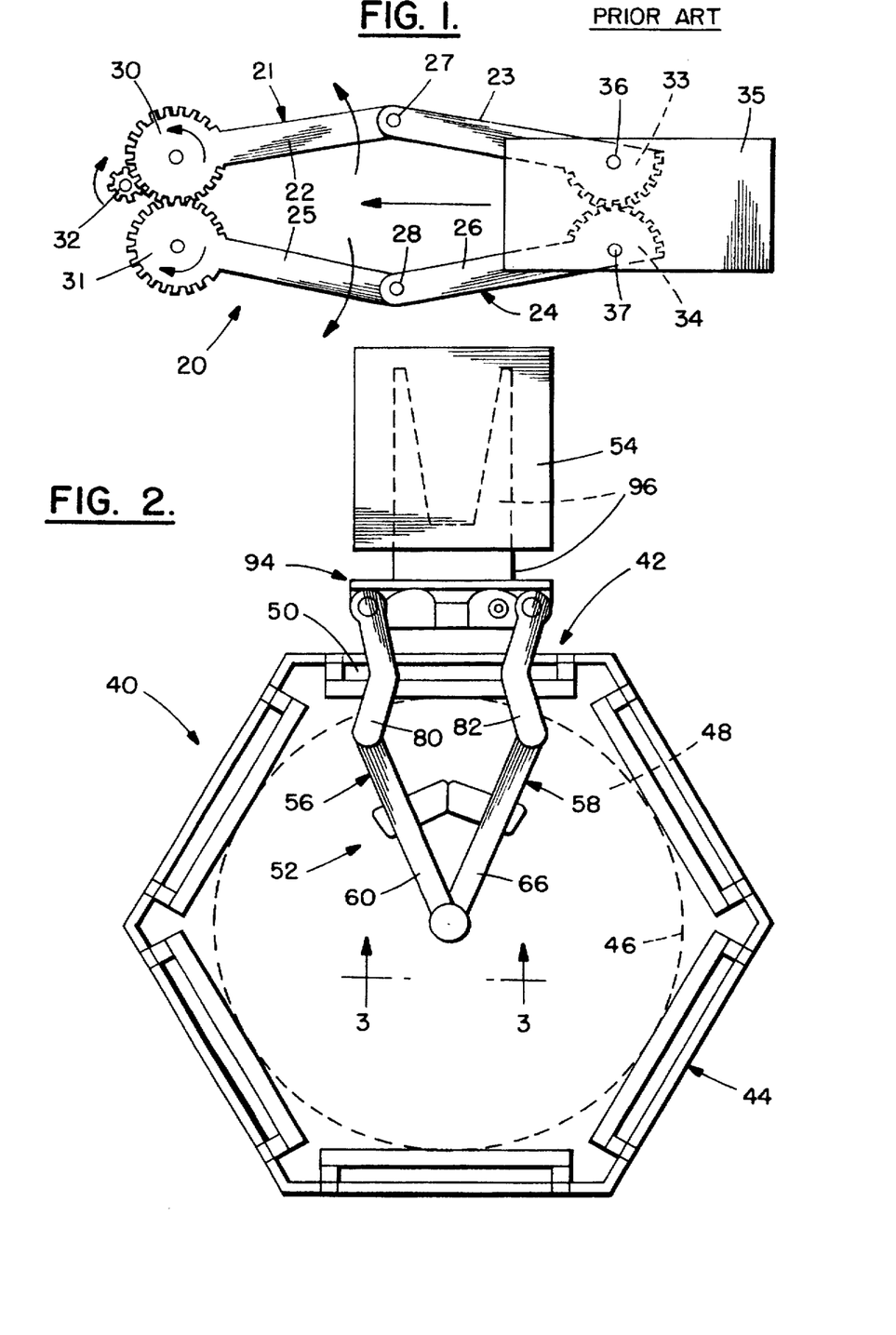
FIG. 1 is a top plan view of a known articulated arm assembly.
FIG. 2 is a top plan view of a processing system for semiconductor devices utilizing an articulated arm assembly embodying the present invention.

Turn now to the drawings and, initially, to FIG. 1 which is a plan view of an articulated arm assembly 20 of known apparatus of the construction disclosed in U.S. Pat. Nos. 4,666,366, 4,730,976 and 4,909,701 mentioned above. The articulated arm assembly 20 includes a first articulated arm 21 and a second articulated arm 24. The articulated arm 21 is comprised of two segments, a drive segment 22 and a driven segment 23, which are joined by a pinned connection 27. Likewise, the articulated arm 24 is comprised of two segments, a drive segment 25 and a driven segment 26, which are joined by a pinned connection 28. In one embodiment, the drive segments 22, 25 may be of less length than the driven segments 23, 26 and in another embodiment, the drive segments 22, 25 may be of the same length as the driven segments 23, 26.

The drive segments 22, 25 include generally circular gears 30, 31, respectively. The gears 30, 31 may be integrally formed as part of the drive segments 22, 25 or they be individually formed and affixed to the drive segments by any suitable fastening method. The gear 30 is operatively coupled to a drive pinion 32. The gear 30 is driven by the drive pinion 32 and in turn gear 30 drives gear 31.

The driven segments 23, 26 include semicircular antirotation gears 33, 34, respectively. A platform 35 or other suitable holder for carrying an object is coupled to the antirotation gears 33, 34 by bearings 36, 37. The antirotation gears 33, 34 may be replaced by frictional surfaces or cable and sheave assemblies which could also prevent the rotation of the ends of driven segments 23, 26.

It can be appreciated that as the drive pinion 32 rotates in a clockwise direction, gear 30 and drive segment 22 rotate in a counterclockwise direction, and gear 31 and drive segment 25 rotate in a clockwise direction. Consequently, the articulated arms 21, 24 retract in a "froglike" motion and displace the platform 35 in a harmonic motion toward the drive gears 30, 31. The antirotation gears 33, 34 prevent skewing of the platform 35, thereby providing a straight line motion to the object being transported.

The harmonic motion of the platform 35 is an important feature of the arm assembly 20 and of the present invention. When the articulated arms 31, 34 are in their fully extended positions, they are substantially parallel. When the platform 35 is retracted from the fully extended position, the platform accelerates relatively slowly from zero velocity until it reaches the midpoint of the fully extended articulated arms where it reaches its maximum velocity. After the platform 35 reaches the midpoint, it begins to decelerate until it reaches its resting point over the gears 30, 31.

An object, such as a silicon wafer, disposed on the platform 35 may have highly polished surfaces and may be held on the platform by friction alone. Any abrupt acceleration of the platform, therefore, would cause the wafer to slide. The gentle acceleration and deceleration of the harmonic motion described above, however, minimizes the tendency of the object to slide, thereby preventing the abrasion of the object and preventing it from colliding with other objects. Where applicable, suction or clamps may be used for additional safety.

It can be appreciated that if the platform 35 is resting over the gears 30, 31 and that if the drive pinion 32 is rotated in a counter clockwise direction, then the articulated arms 21, 24 and the platform 35 will be extended in a "froglike" motion. The platform 35 will move in a harmonic motion until the articulated arms 21, 24 are fully extended.

As noted above, the drive segments 22, 25 may be of less length than the driven segments 23, 26 and, in another embodiment, the drive segments 22, 25 may be of the same length as the driven segments 23, 26. However, the arm assembly 20 will be inoperative if the drive segments are of greater length than the driven segments. If the drive segments 22, 25 and the driven segments 23, 26 are of equal length, the platform 25 may be moved from an extreme position to the right in FIG. 1 (as shown) to an extreme position to the left in FIG. 1 (not shown). If the drive segments 22, 23 are of lesser length than the driven segments 23, 26, the platform 35 will come to rest over the drive gears 30, 31 but before the drive segments 22, 25 come to be aligned with the driven segments 23, 26, respectively.

The intent of the present invention is to utilize the operational benefits of the prior art apparatus as just described while providing it in a smaller package to assure rotational clearance with modern semiconductor wafer processing systems and assuring that deflection of the articulated arms is minimized when they are in the extended position.

Turn now to FIG. 2 which illustrates a processing system 40 for operating on silicon planar substrates such as wafers and flat panels. Throughout the remainder of this disclosure, the term "wafer" will be used for purposes of consistency to refer to such substrates, but it will be understood that it is intended to be used in the broad context so as to be applicable to all substrates. The processing system 40 includes an entry 42 from a load lock (not shown) for initially receiving wafers to be processed and a plurality of entries 44 into associated wafer processing stations (not shown) for operations on the surfaces of the wafers such as imaging, plasma etching, and the like. It is typical for the processing stations to be arranged about a closed locus as indicated by a dashed line 46. A transport chamber 48 is disposed concentrically within the load lock and the processing stations for singly transferring wafers to be processed and after processing between the load lock and one or more of the processing stations. A plurality of isolation valves 50 are individually provided at the interfaces of the load lock and of the several processing stations with the transport chamber 48.

With the structure of the processing system 40 serving as a support in a suitable manner, transfer apparatus 52 embodying the invention, as more specifically illustrated in FIGS. 3-6, is provided for transferring an object 54 such as a semiconductor wafer. A pair of articulated arms 56, 58 are suitably mounted within the system 40 so as to move the wafer 54 from an external location as depicted in FIG. 2, then through an entry 42 into the processing system as depicted in FIGS. 7A, 7B, and 7C, and finally completely into the transport chamber 48 as depicted in FIG. 7D.

The articulated arm 56 includes a first drive member 60 disposed for rotation about a drive axis 62 which is the longitudinal axis of a drive shaft 64 to which it is fixed at its proximal end. The articulated arm 58 includes a second drive member 66 which is fixed at its proximal end to a tubular drive shaft 67 coaxial with the drive shaft 64 and, therefore, also disposed for rotation about the drive axis 62. Viewing FIG. 3, a prime mover such as a motor 68 is coupled to drive a shaft 70 on which is keyed a drive gear 72. The drive gear 72 is simultaneously in driving engagement with a pinion gear 74 keyed to the drive shaft 67 and, via an idler gear 76, with a pinion gear 78 keyed to the drive shaft 64. With this construction, the articulated arms 56, 58 are rotated in equal but opposite directions upon operation of the drive motor 68.

The articulated arm 56 also includes a first elongated driven member 80 and the articulated arm 58 also includes a second elongated driven member 82. In each instance, it will be noted that the driven members are no greater in length than the drive members and that the first and second drive members 60, 66 are joined by pinned connections 84 to the first and second driven members, 80, 82, respectively. In this regard, the following description of the pinned connection 84 presented with respect to the articulated arm 58 applies also to the articulated arm 56. At the proximal end of the driven member 82 is fastened, as by means of screws 86, a suitable bearing support 88 which extends transversely of the plane of the driven member. The bearing support 88 projects into, and is coaxial with, a mounting bore 90 formed in a distal end of the second drive member 66. Suitable bearings 92 provide relative pivotal, or scissors-type, motion between the drive member 66 and the driven member 82.

Figure 4:
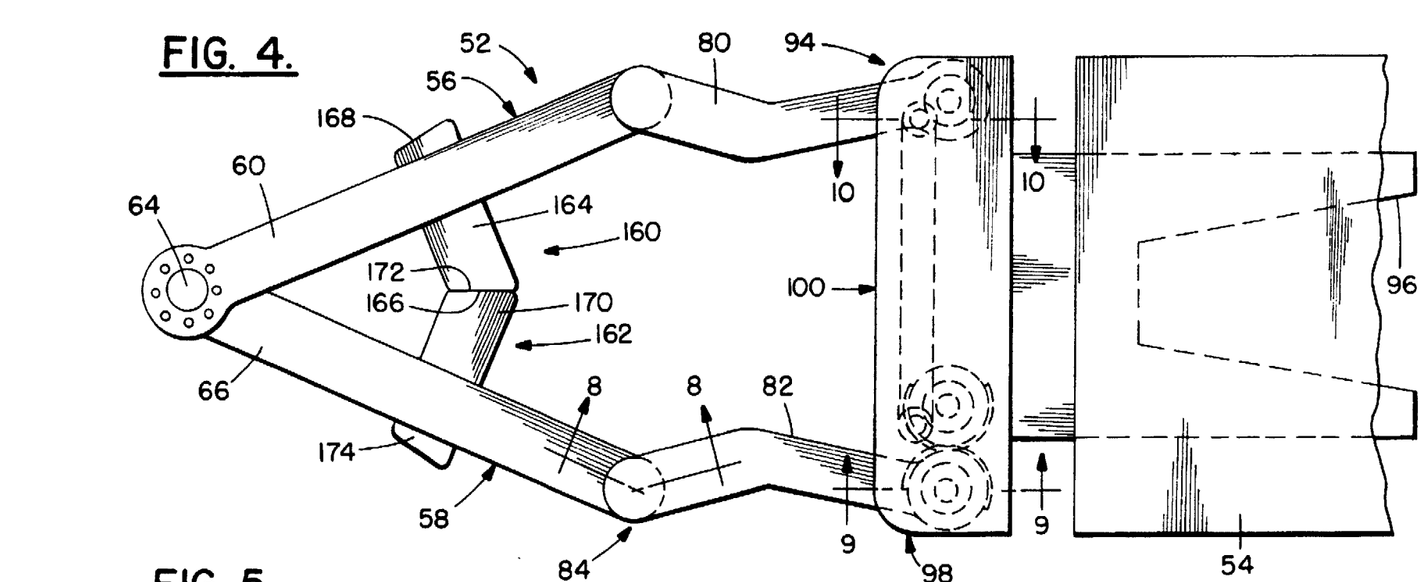
FIG. 4 is a top plan view illustrating in greater detail the articulated arm assembly of FIG. 2.
Figure 5:
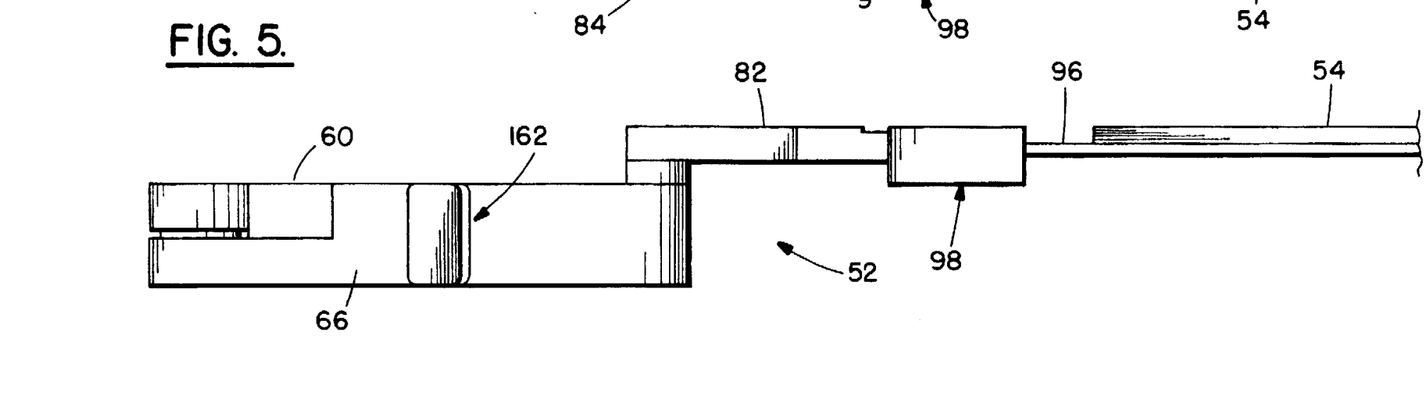
FIG. 5 is a side elevation view of the articulated arm assembly illustrated in FIG. 4.
Figure 6:
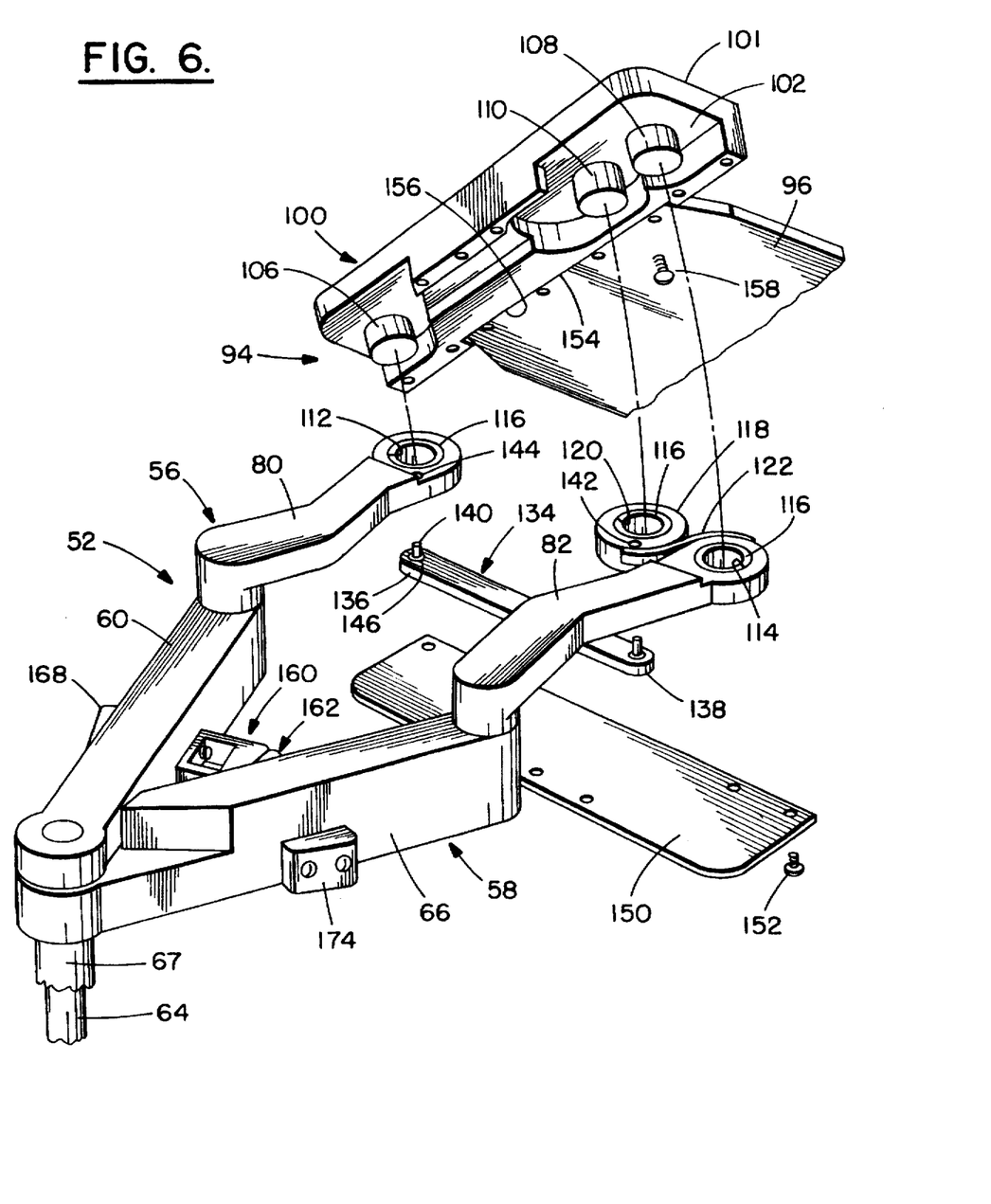
FIG. 6 is an exploded perspective view of the articulated arm assembly of the present invention.
Figure 7A:
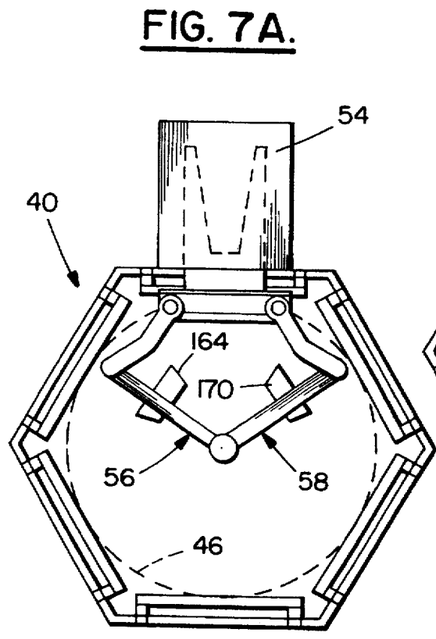
FIGS. 7A, 7B, 7C and 7D are top plan views illustrating successive positions of the articulated arm assembly of the present invention.
Figure 7B:
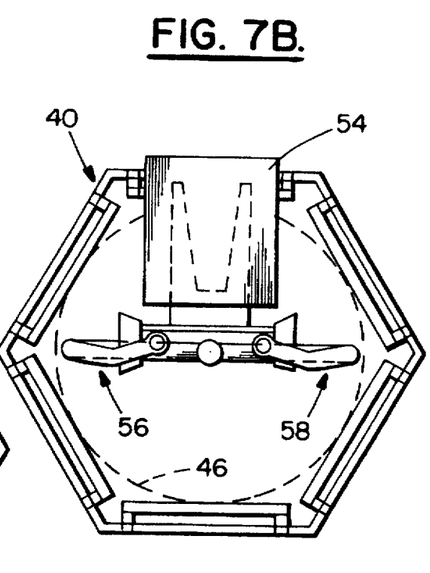
Figure 7C:
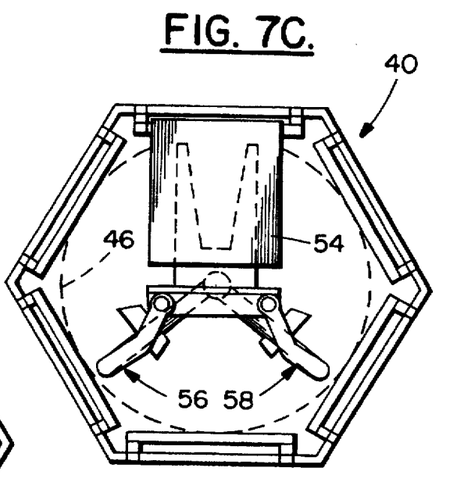
Figure 7D:
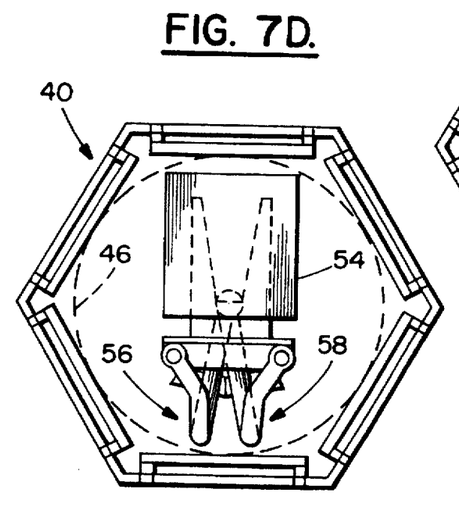
Figure 8:
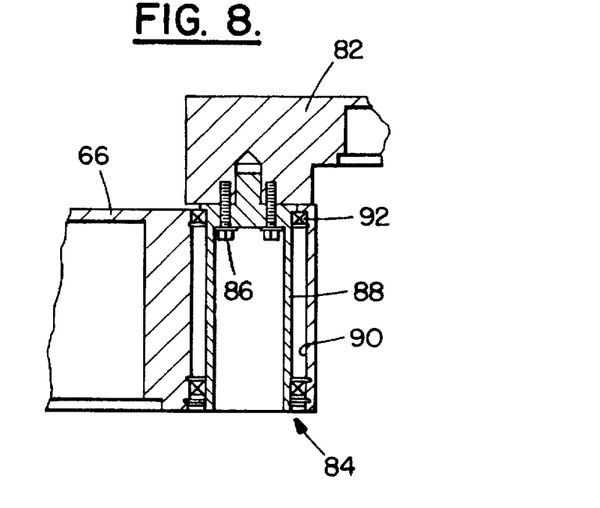
FIG. 8 is a detail cross section view taken generally along line 8—8 in FIG. 4.

As seen particularly well in FIGS. 2, 4, and 6, a holding mechanism 94 including a platform 96 for supporting the wafer 54 is pivotally coupled to the driven members 80, 82 at their distal ends. The driven members are spaced apart and are operatively engaged with the holding mechanism 94 so as to prevent rotation of the platform as the motor 68 is operated for rotating the first and second drive members 60, 66 about the drive axis 62 from an initial position (FIG. 2) at which the drive members subtend a first acute angle and with the holding platform being at an initial position distant from the drive axis 62 through an intermediate position (FIG. 7B) at which the drive members subtend an angle of 180° to a final position (FIG. 7D) at which the first and second drive members subtend a second acute angle oppositely disposed from the first acute angle with the holding platform at a final position overlying the drive axis.

The holding mechanism 94 includes a wrist member 98 for mounting the platform 96. With particular attention now to FIG. 6, the wrist member 98 is seen to include a wrist plate 100 extending transverse of the extend-retract path for the platform 96 as it moves between the initial position depicted in FIG. 2 and the final position depicted in FIG. 7D. The wrist plate has upper and lower surfaces 101 and 102, respectively, and first, second, and third cylindrical pivot drums 106, 108, 110, respectively, project from the lower surface 102. The first, second, and third pivot drums have parallel axes which are mutually perpendicular to a plane of the wrist plate and to a plane containing the driven members 80, 82 and the idler bushing 118.

The first and second pivot drums 106, 108 are distant from one another. The first and third pivot drums 106, 110 are adjacent one another.

Figure 9:
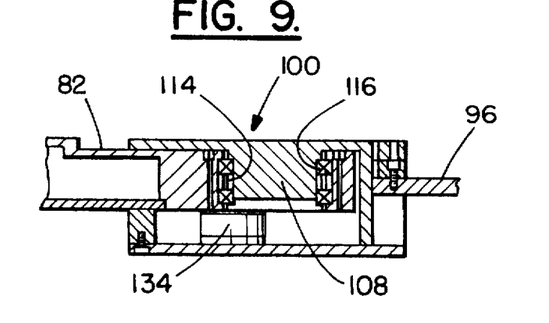
FIG. 9 is a detail cross section view taken generally along line 9—9 in FIG. 4.

The distal end of the first driven member 80 has a mounting bore 112 therethrough which is pivotally engaged with the first pivot drum 106 and the distal end of the second driven member 82 has a mounting bore 114 therethrough which is pivotally engaged with the second pivot drum 108. As seen in FIG. 9, a bearing 116 may be interposed between the mounting bore and the associated pivot drum for the smoothest possible operation between the driven members 80, 82 and the wrist member 98.

Figure 10:
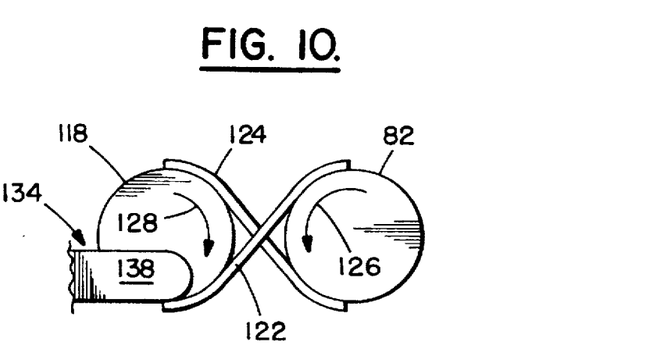
FIG. 10 is a diagrammatic top plan view illustrating one extreme position of components illustrated in FIGS. 4 and 6.
Figure 11:
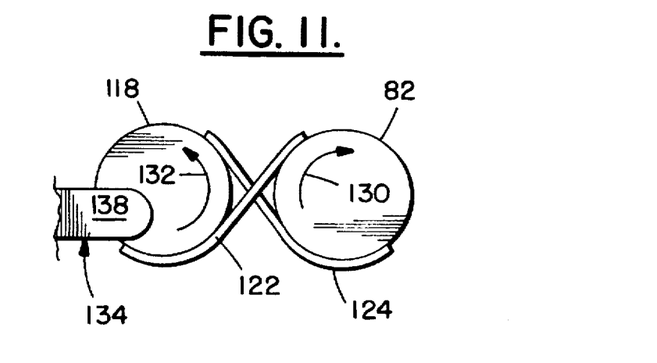
FIG. 11 is a diagrammatic top plan view illustrating another extreme position of components illustrated in FIGS. 4 and 6.

An idler bushing 118 is rotatably mounted on the third pivot drum 110. As with the driven members 80, 82, the idler bushing 118 may be provided with a bearing 116 interposed between a mounting bore 120 therein and the pivot drum 110. Additionally, the idler bushing 118 is operatively connected in a suitable fashion with the distal end of the second driven member such that rotation of the second driven member 82 relative to the second pivot drum 108 in one direction causes rotation of the idler bushing in an opposite direction. This construction is indicated in FIGS. 10 and 11 which illustrate a pair of connecting straps 122, 124 which extend, oppositely, between the outer peripheral surfaces of the idler bushing 118 and of the distal end of the second driven member 82 and are fixedly attached adjacent their ends, respectively, to the idler bushing and to the second driven member. Thus, viewing FIG. 10, when the driven member 82 is rotated in the counterclockwise direction as indicated by an arrow 126, the idler bushing is simultaneously rotated in the clockwise direction as indicated by an arrow 128. In an opposite manner, viewing FIG. 11, when the driven member 82 is rotated in the clockwise direction as indicated by an arrow 130, the idler bushing is simultaneously rotated in the counterclockwise direction as indicated by an arrow 132.

A wrist link 134 has opposed ends 138, 136 which are pivotally engaged, respectively, with the idler bushing 118 and with the distal end of the first driven member 80 so as to impart an equal and opposite rotational movement to the first drive member with respect to the second drive member.

Figure 12:
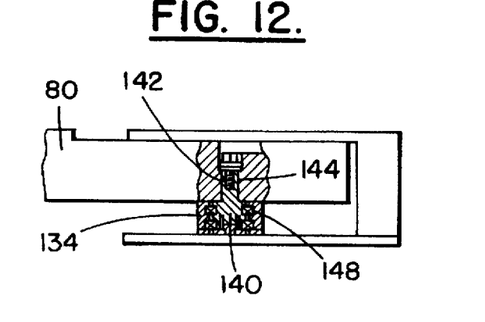
FIG. 12 is a detail side elevation view of parts illustrated in FIGS. 4 and 6, certain parts being broken away and shown in section.

More specifically, as seen in FIG. 12, a mini-drum 140 is attached to a distal end of the first driven member 80 by a screw 142 received in a counterbore 144. The mini-drum is received for pivotal engagement with a bore 146 in the end 136 of the wrist link 134. As with the pivotal connections between the driven members 80, 82, and the idler bushing with their associated pivot drums, a bearing 148 is preferably interposed between the mounting bore 146 and the mini-drum 140 to provide smoothness of operation.

The end result of the construction just described is that the orientation of the platform 96 remains substantially unchanged as the holding mechanism 94 moves between the initial and final positions.

While the operative connection between the idler bushing 118 and the distal end of the second driven member 82 have been described as the connecting straps 122, 124, it will be appreciated that such a construction is not intended to be limiting of the invention. Indeed, such a connection may alternatively be achieved by means of belts or chains or the outer peripheral surfaces of the adjoining members may be frictionally engaged or they may be provided with meshing gear teeth.

The wrist member 98 also includes a lower plate 150 which is attached to the wrist plate 100 by means of screws 152. The lower plate serves as a retainer for the idler bushing 118 and generally encapsulates the components of the wrist member 98 to protect them against outside influences and to assure that mechanism does not improperly interfere with the other operating components of the transfer apparatus 52. Also, a mounting edge 154 of the platform 96 is received in an elongated recess 156 of the wrist plate 100 and secured thereto by means of suitable fasteners such as screws 158.

The transfer apparatus 52 also includes mutually engageable stop devices 160, 162 on the first and second articulated arms, respectively. The stop devices serve to define the initial position (FIG. 2) and the final position (FIG. 7D) of the articulated arms and of the platform 96. The stop device 160 includes a first stop member 164 mounted on the first drive member 60, extending transversely of the drive member, and having a first extended stop surface 166 generally facing toward the second drive member 66 and a first retracted stop surface 168 generally facing away from the second drive member. In a similar fashion, the stop device 162 includes a second stop member 170 mounted on the second drive member 66, extending transversely of the second drive member, and having a second extended stop surface 172 generally facing toward the first drive member 60 and a second retracted stop surface 174 generally facing away from the first drive member 60. The first and second articulated arms 56, 58 assume the initial position (FIG. 2) when the first and second extended stop surfaces 166, 172 are engaged. The first and second articulated arms assume the final position (FIG. 7D) when the first and second retracted stop surfaces 168, 174 are engaged.

Figure 3:
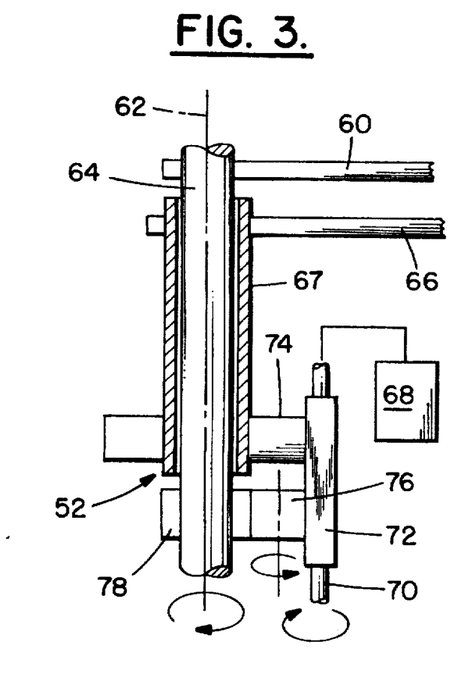
FIG. 3 is a view taken generally along line 3—3 in FIG. 2, certain parts being cut away and shown in section, to illustrate a drive mechanism for the articulated arm assembly of FIG. 2.

Although the foregoing description relates that the respective drive shafts 64, 67 are coaxial as clearly illustrated in FIGS. 3 and 4, it is within the scope of the invention that they be parallel but spaced apart so as to have the construction illustrated in FIG. 1.

Figure 13:
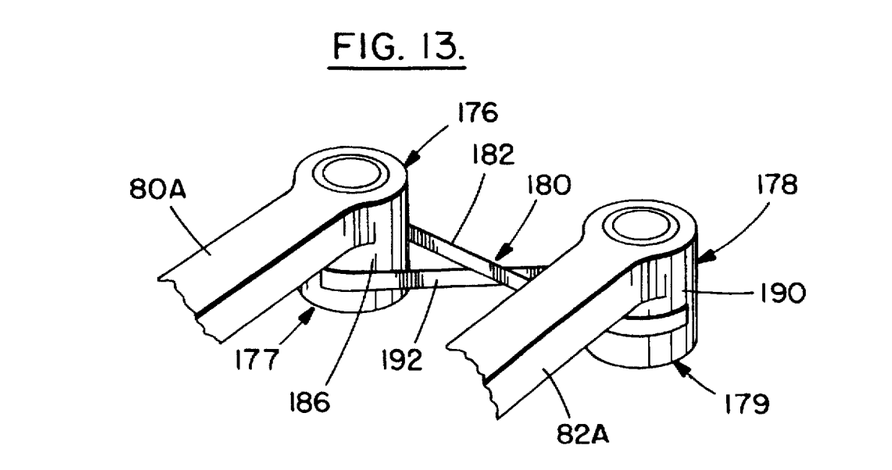
FIG. 13 is a detail perspective view, generally similar to a part of FIG. 6, illustrating another embodiment of the invention.
Figure 14:
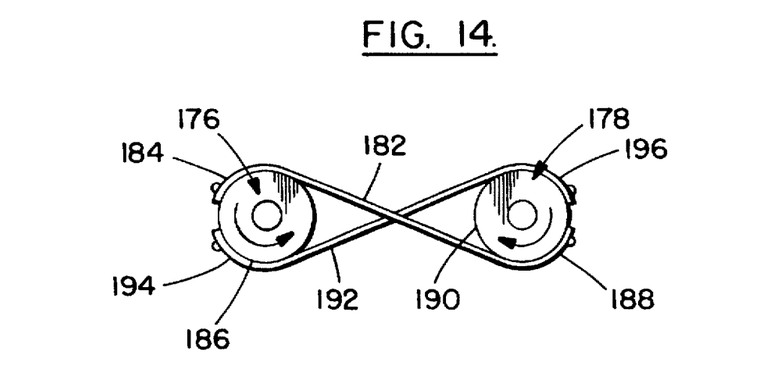
FIG. 14 is a detail top plan view of FIG. 13.

Also, it will be appreciated that the rigid wrist link 134 (FIGS. 4 and 6) may be replaced with a less rigid form of interconnection as illustrated in FIGS. 13 and 14. In this instance, a distal end 176 of a modified driven member 80A is formed with a downwardly projecting cylindrical segment 177. Similarly, a distal end 178 of a modified driven member 82A is formed with a downwardly projecting cylindrical segment 179. An elongated flexible strap mechanism 180 extends between and is engaged with the segments 177, 179 so as to impart an equal and opposite rotational movement to the first drive member with respect to the second drive member. The elongated flexible strap mechanism includes a first strap 182 which is attached at a first end 184 (FIG. 14) to an outer peripheral surface 186 of the distal end 176 of the driven member 80A and extends proximally therearound in a clockwise direction until it advances tangentially away therefrom and upon reaching the segment 179 extends proximally therearound in a counterclockwise direction until it is attached at a second end 188 to the outer peripheral surface 190 thereof.

In a similar fashion, a second strap 192 is attached at a first end 194 to the outer peripheral surface 186 of the distal end 176 of the first driven member 80A and extends proximally therearound in a counterclockwise direction until it advances tangentially away therefrom and upon reaching the segment 179 extends proximally therearound in a clockwise direction until it is attached at a second end 196 to the outer peripheral surface 190 thereof.

By means of the elongated strap mechanism 180 as just described, an equal and opposite rotational movement is imparted to the first drive member 60 with respect to the second drive member 66. More specifically, as the driven member 80A rotates in a clockwise direction, the segment 179 and with it the driven member 82A is thereby caused to rotate in a counterclockwise direction.

With the modified construction illustrated in FIGS. 13 and 14, the idler bushing 118 is dispensed with resulting in a significant reduction in parts count including the elimination of bearings. Thus, the elongated strap mechanism 180 may be a preferred construction if the distance between the segments 177, 179 is not unduly great.

With the description of the invention now complete, it is considered desirable to take note of the fact that in prior art constructions of the type illustrated in FIG. 1, the driven segments 23, 26 must be longer than the drive segments 22, 25 if the platform 35 is to be capable of retraction as close as possible to a position overlying the gears 30, 31. However, with that construction, even with the drive segments and the driven segments being of equal length, there can be no assurance that continued operation of the drive pinion 32 will result in the retraction to the position depicted in FIG. 7D of the present invention. At best, because of the kinematics of the prior art system, the platform 35 can only be retracted under control, meaning that the direction of motion is controlled, to the position illustrated in FIG. 7B of the present invention.

In the present invention, while the combined length of the driven members 80, 82 and the spacing between the mounting bores 112, 114 must be at least as long as, or longer than, the combined length of the drive members 60, 66, and any spacing between the axes of the shafts 64, 67, they are caused to be effectively, or kinematically, shorter by the spacing of the distal ends of the driven members at their connections to the wrist plate 100. The effect, then, is that the driven members 80, 82 are shorter than the drive members 60, 66. As a result, when the included angle between the driven members 60, 66 approaches 180° (FIG. 7B), the effective length of the drive members 80, 82 diminishes, enabling the platform 96 and its supported object 54 to move to the FIG. 7C position, then to the FIG. 7D position such that the dashed line 46 (FIGS. 1 and 7A–7D) is minimized. Additionally, the wrist link 134 assures that the driven member 80 will perfectly track the driven member 82.

While preferred embodiments of the invention have been disclosed in detail, it should be understood by those skilled in the art that various other modifications may be made to the illustrated embodiments without departing from the scope of the invention as described in the specification and defined in the appended claims.

What is claimed is:

1. Apparatus for transferring an object comprising:
   a support;
   first and second articulated arms mounted on said support;
   said first articulated arm having a first elongated drive member disposed for rotation about a drive axis and a first elongated driven member extending between proximal and distal ends, being no greater in length than said first drive member, and being pivotally mounted to said first drive member at said proximal end said first driven member having a cylindrical bore adjacent said distal end;
   said second articulated arm having a second elongated drive member disposed for rotation about said drive axis and a second elongated driven member extending between proximal and distal ends, being no greater in length than said second drive member, and biting pivotally mounted to said second drive member at said proximal end, said second driven member having a cylindrical bore adjacent said distal end;
   holding means pivotally coupled to said first and second driven members for travel along an extend-retract path as it moves between an initial position and a final position, said holding means including:
   a wrist member including:
      a wrist plate extending transverse of said extend retract path and having upper and lower surfaces;
      first, second, and third cylindrical pivot drums projecting from said lower surface, said first and second pivot drums being distant from one another, said first and third pivot drums being adjacent one another, the distal born of said first driven member being pivotally engaged with said first pivot drum and the distal bore of said second driven member being pivotally engaged with said second pivot drum;
      an idler bushing rotatably mounted on said third pivot drum, means operatively connecting said idler bushing with said distal end of said second driven member such that rotation of said second driven member relative to said second pivot drum in one direction causes rotation of said idler bushing in an opposite direction;
      a wrist link extending between and pivotally engaged at first and second opposed ends with said idler bushing and with said distal end of said first driven member, respectively, so as to impart an equal and opposite rotational movement to said first drive member with respect to said second drive member; and
      a platform for receiving the object thereon fixed to and extending away from said wrist member;
   drive means for rotating said first and second drive members about said drive axis from an initial position whereat said first and second drive members subtend a first acute angle with said holding means at said initial position distant from said drive means through an intermediate position whereat said first and second drive members subtend an angle of 180° to said final position whereat said first and second drive members subtend a second acute angle oppositely disposed from said first acute angle with said holding means at a final position overlying said drive axis;
   whereby as said holding means moves between said initial and final positions, the orientation of said platform remains substantially unchanged.

2. Apparatus as set forth in claim 1 wherein said first and second drive members are joined by pinned connections to said first and second driven members, respectively.

3. Apparatus as set forth in claim 1 including:
   mutually engageable stop means on said first and second articulated arms, respectively, defining said initial position and said final position.

4. Apparatus as set forth in claim 3
wherein said stop means includes:
   a first stop member mounted on said first drive member and extending transversely thereof, said first stop member having a first extended stop surface generally facing toward said second drive member and a first retracted stop surface generally facing away from said second drive member; and
   a second stop member mounted on said second drive member and extending transversely thereof, said second stop member having a second extended stop surface generally facing toward said first drive member and a second retracted stop surface generally facing away from said first drive member;
   said first and second articulated arms assuming said initial position when said first and second extended stop surfaces are engaged, said first and second articulated arms assuming said final position when said first and second retracted stop surfaces are engaged.

5. Apparatus as set forth in claim 1 wherein said first, second, and third pivot drums have parallel axes which are mutually perpendicular to a plane containing said driven members and said idler bushing.

6. Apparatus for transferring an object comprising:

a support;

first and second articulated arms mounted on said support;

said first articulated arm having a first elongated drive member disposed for rotation about a first drive axis and a first elongated driven member extending between proximal and distal ends, being no greater in length than said first drive member, and being pivotally mounted to said first drive member at said proximal end, said first driven member having a cylindrical bore adjacent said distal end;

said second articulated arm having a second elongated drive member disposed for rotation about a second drive axis parallel to said first drive axis and a second elongated driven member extending between proximal and distal ends, being no greater in length than said second drive member, and being pivotally mounted to said second drive member at said proximal end, said second driven member having a cylindrical bore adjacent said distal end;

holding means pivotally coupled to said first and second driven members for travel along an extend-retract path as it moves between an initial position and a final position;

a wrist member including:

a wrist plate extending transverse of said extend retract path and having upper and lower surfaces;

first, second, and third cylindrical pivot drums projecting from said lower surface, said first and second pivot drums being distant from one another, said first and third pivot drums being adjacent one another, the distal bore of said first driven member being pivotally engaged with said first pivot drum and the distal bore of said second driven member being pivotally engaged with said second pivot drum;

an idler bushing rotatably mounted on said third pivot drum, means operatively connecting said idler bushing with said distal end of said second driven member such that rotation of said second driven member relative to said second pivot drum in one direction causes rotation of said idler bushing in an opposite direction;

a wrist link extending between and pivotally engaged at first and second opposed ends with said idler bushing and with said distal end of said first driven member, respectively, so as to impart an equal and opposite rotational movement to said first drive member with respect to said second drive member; and a platform for receiving the object thereon fixed to and extending away from said wrist member;

drive means for rotating said first and second drive members about said first and second drive axes, respectively, from said initial position whereat said first and second drive members subtend a first acute angle with said holding means at said initial position distant from said drive means through an intermediate position whereat said first and second drive members subtend an angle of 180° to said final position whereat said first and second drive members subtend a second acute angle oppositely disposed from said first acute angle with said holding means at said final position overlying said drive axis;

whereby as said holding means moves between said initial and final positions, the orientation of said platform remains substantially unchanged.

7. Apparatus as set forth in claim 6 wherein said first and second drive axes are coaxial.

8. Apparatus as set forth in claim 1 wherein said means operatively connecting includes:

elongated flexible strap means extending between and engaged at first and second opposed ends, respectively, with said idler bushing and with said distal end of said second driven member, so as to impart an equal and opposite rotational movement to said first driven member with respect to said second driven member.

9. Apparatus as set forth in claim 8 wherein said first, second, and third pivot drums have parallel axes which are mutually perpendicular to a plane containing said driven members and said idler bushing.

* * * * *